United States Patent
Lee et al.

(10) Patent No.: US 12,389,661 B2
(45) Date of Patent: Aug. 12, 2025

(54) METHOD FOR MODIFYING METAL-INCLUDING MATERIAL IN SEMICONDUCTOR MANUFACTURING PROCESS

(71) Applicant: TAIWAN SEMICONDUCTOR MANUFACTURING COMPANY, LTD., Hsinchu (TW)

(72) Inventors: Li-Chen Lee, Hsinchu (TW); Ren-Kai Chen, Hsinchu (TW); Ying-Liang Chuang, Hsinchu (TW); Ming-Hsi Yeh, Hsinchu (TW); Kuo-Bin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 568 days.

(21) Appl. No.: 17/731,057

(22) Filed: Apr. 27, 2022

(65) Prior Publication Data

US 2023/0352346 A1    Nov. 2, 2023

(51) Int. Cl.
*H10D 84/03* (2025.01)
*C23C 16/40* (2006.01)
*H10D 30/01* (2025.01)
*H10D 30/67* (2025.01)
*H10D 64/01* (2025.01)
*H10D 84/01* (2025.01)

(52) U.S. Cl.
CPC ......... *H10D 84/038* (2025.01); *C23C 16/403* (2013.01); *H10D 64/01* (2025.01); *H10D 84/017* (2025.01); *H10D 84/0186* (2025.01); *H10D 30/031* (2025.01); *H10D 30/6735* (2025.01)

(58) Field of Classification Search
None
See application file for complete search history.

(56) References Cited

U.S. PATENT DOCUMENTS

| | | | |
|---|---|---|---|
| 6,054,255 A * | 4/2000 | Nakaoka | G03F 7/16 427/407.1 |
| 10,276,452 B1 * | 4/2019 | Seshadri | H10D 88/01 |
| 2004/0152329 A1 * | 8/2004 | Di Dio | H01L 21/0274 257/E21.027 |
| 2005/0175786 A1 * | 8/2005 | Singh | A61M 35/006 427/407.1 |
| 2007/0030309 A1 * | 2/2007 | McAvoy | B41J 2/1646 347/54 |
| 2009/0036625 A1 * | 2/2009 | Chang | C08F 222/04 526/272 |
| 2012/0313170 A1 * | 12/2012 | Chang | H10D 62/292 257/E21.409 |
| 2022/0328427 A1 * | 10/2022 | Coppola | H01L 23/564 |

* cited by examiner

*Primary Examiner* — Dale E Page
*Assistant Examiner* — Patrick Cullen
(74) *Attorney, Agent, or Firm* — Birch, Stewart, Kolasch & Birch, LLP

(57) ABSTRACT

A method for manufacturing a semiconductor device includes forming a metal-including layer over a semiconductor substrate; forming a hydrophobic polymer layer over the metal-including layer; and forming an amphiphilic polymer layer between the metal-including layer and the hydrophobic polymer layer so as to enhance a bonding force therebetween.

20 Claims, 15 Drawing Sheets

ABSTRACT AND SPEC BEGIN

METHOD FOR MODIFYING METAL-INCLUDING MATERIAL IN SEMICONDUCTOR MANUFACTURING PROCESS

BACKGROUND

Along with increasing demands on more advanced semiconductor devices, manufacturing processes thereof also encounter a lot of challenges. To overcome such challenges, the industry has put much effort in developing different techniques applicable to methods for manufacturing semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
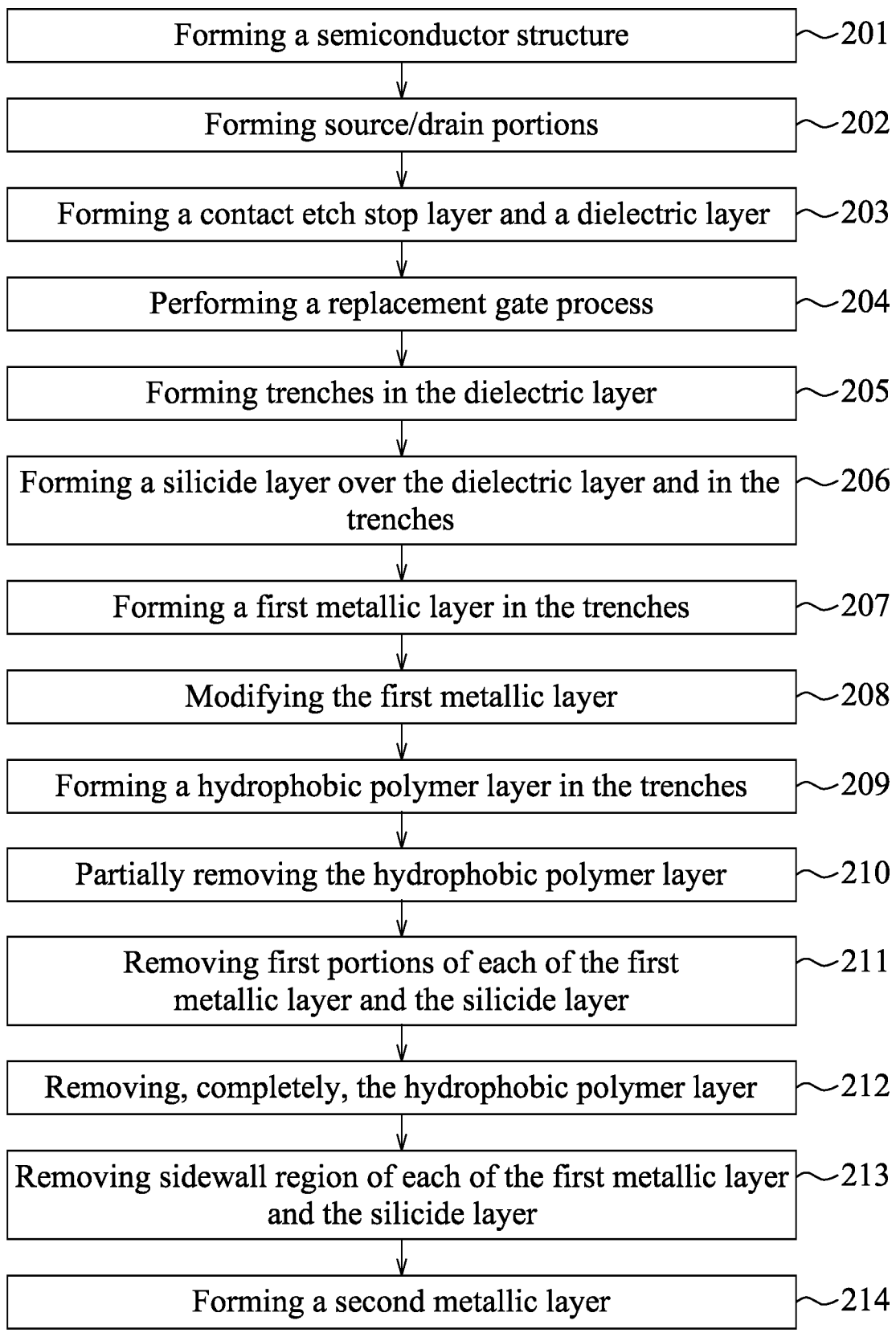
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for manufacturing a semiconductor device, in which a surface of a metal-including layer is modified by forming an amphiphilic polymer layer between the metal-including layer and a hydrophobic polymer layer (e.g., bottom anti-reflective coating (BARC)) so as to enhance a bonding force therebetween. The present disclosure provides an exemplary method to manufacture, for example, but not limited to, a metal-oxide-semiconductor field effect transistor (MOSFET), such as a planar MOSFET, a fin-type FET (FinFET), a gate-all-around (GAA) nanosheet FET, or other suitable semiconductor devices.

FIG. 1 is a flow diagram illustrating a method for manufacturing the semiconductor device in accordance with some embodiments. FIGS. 2 to 16, 18 and 19 illustrate schematic views of the intermediate stages of the method in accordance with some embodiments. Some repeating structures are omitted in FIGS. 2 to 16, 18 and 19 for the sake of brevity. Additional steps can be provided before, after or during the method, and some of the steps described herein may be replaced by other steps or be eliminated.

Figure 2:
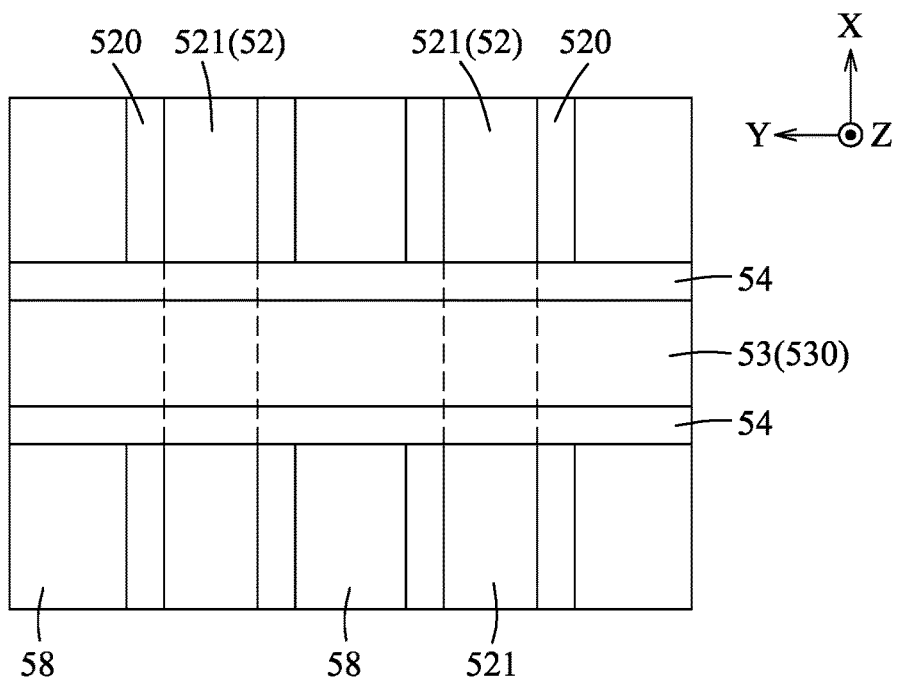
FIGS. 2 to 16, 18 and 19 are schematic views illustrating intermediate stages of the method for manufacturing a semiconductor device in accordance with some embodiments.

Referring to FIG. 1 and the example illustrated in FIG. 2, the method begins at step 201, where a semiconductor structure is formed. FIG. 2 is an enlarged top view of the semiconductor structure in accordance with some embodiments. The semiconductor structure includes a semiconductor substrate 50 (see FIG. 5), a plurality of semiconductor fins 52, a dummy portion 53, a plurality of isolation portions 58, a plurality of fin sidewalls 520, and two gate spacers 54.

The semiconductor substrate 50 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 50 may be doped with p-type impurities or n-type impurities, or undoped. In addition, the semiconductor substrate 50 may be a bulk silicon substrate, a silicon-on-insulator (SOI) substrate, or a germanium-on-insulator (GOI) substrate. Other suitable materials for the semiconductor substrate 50 are within the contemplated scope of the present disclosure.

The semiconductor fins 52 are formed on the semiconductor substrate 50, and may be made from a material same or different from that of the semiconductor substrate 50. Since suitable materials for the semiconductor fins 52 are similar to those for the semiconductor substrate 50, the details thereof are omitted for the sake of brevity. Other suitable materials for the semiconductor fins 52 are within the contemplated scope of the present disclosure. In some embodiments, the semiconductor fins 52 extend in an X direction, and are spaced apart from each other in a Y direction transverse to the X direction. Although two of the semiconductor fins 52 are shown in FIG. 2, the number of the semiconductor fins 52 can be varied according to the layout design of the semiconductor structure.

The isolation portions 58 are formed on the semiconductor substrate 50 to isolate the semiconductor fins 52 from each other. The isolation portions 58 may each be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation portions 58 are within the contemplated scope of the present disclosure.

The dummy portion 53 extends in the Y direction, and is formed over the semiconductor fins 52. In some embodiments, the dummy portion 53 includes a hard mask 530, a dummy gate 531 (see FIG. 4) formed beneath the hard mask 530, and a dummy gate dielectric (not shown) formed beneath the dummy gate 531 to separate the dummy gate 531 from the semiconductor fins 52. In some embodiments, the hard mask 530 may include silicon nitride, silicon oxide, silicon oxynitride, or combinations thereof; the dummy gate 531 may include polycrystalline silicon, single crystalline silicon, amorphous silicon, or combinations thereof; and the dummy dielectric may include silicon oxide, silicon nitride, silicon oxynitride, high dielectric constant (k) materials, or combinations thereof. Other suitable materials for the dummy portion 53 are within the contemplated scope of the present disclosure.

The gate spacers 54 are formed at two opposite sides of the dummy portion 53, and each of the semiconductor fins 52 has two recessed fin portions 521 exposed from the dummy structure 53 and the gate spacers 54. At two opposite sides of each of the recessed fin portions 521, two corresponding ones of the fin sidewalls 520 are formed. Each of the gate spacers 54 and the fin sidewalls 520 may include silicon oxide, silicon nitride, or a combination thereof. Other suitable materials for the gate spacers 54 and the fin sidewalls 520 are within the contemplated scope of the present disclosure.

In some embodiments, the semiconductor structure may be formed by (i) patterning the semiconductor substrate 50 to form the semiconductor fins 52, (ii) forming an isolation layer over the semiconductor substrate 50 and the semiconductor fins 52 followed by a planarization process, for example, but not limited to, chemical mechanism polishing (CMP), to form the isolation portions 58, (iii) recessing the isolation portions 58 to expose upper portions of the semiconductor fins 52, (iv) forming the dummy portion 53 over the semiconductor fins 52 such that each of the semiconductor fins 52 has two fin portions exposed from and located at two opposite sides of the dummy portion 53, (v) forming, the two gate spacers 54 at two opposite sides of the dummy portion 53, and the two fin sidewalls 520 at two opposite sides of each of the fin portions of the semiconductor fins 52, and (vi) recessing the fin portions of each of the semiconductor fins 52 to form the recessed fin portions 521. Other suitable processes for forming the semiconductor structure 100 are within the contemplated scope of the present disclosure.

Figure 3:
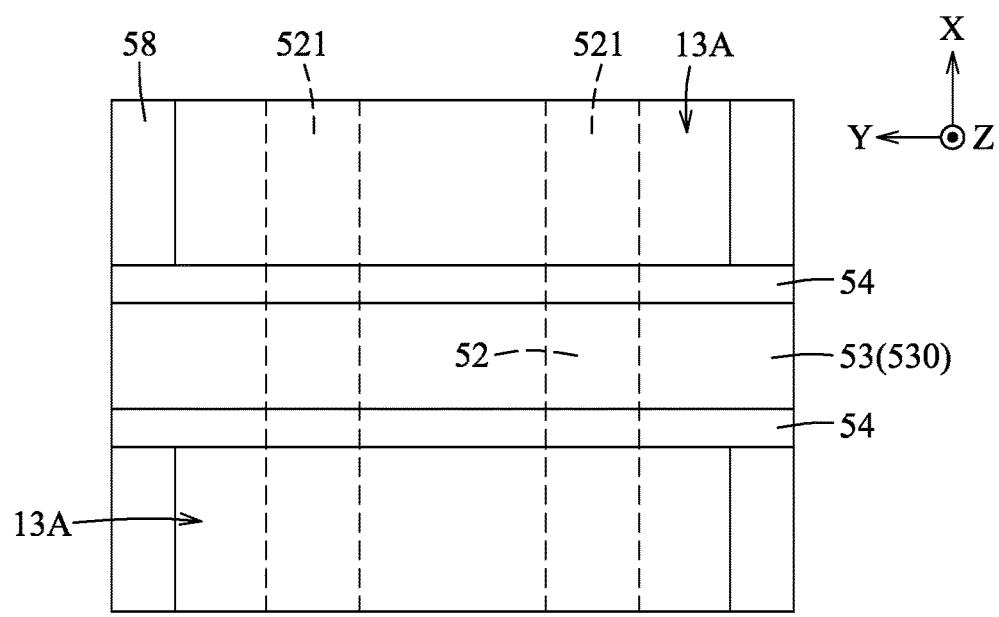
Figure 5:
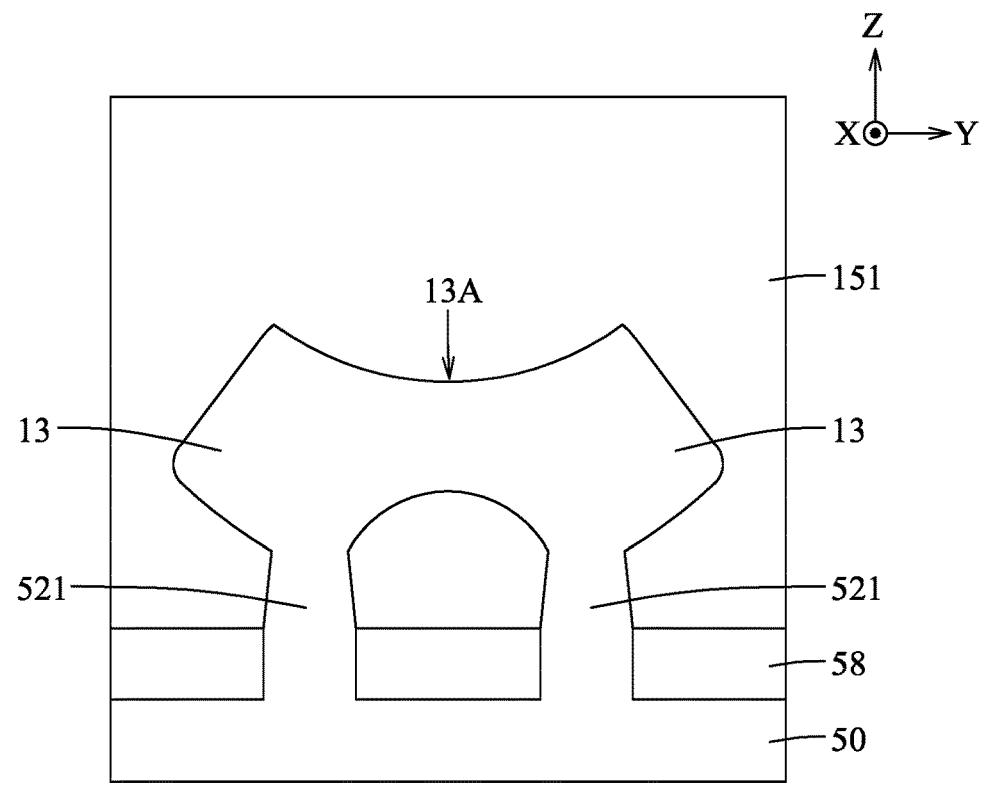

Referring to FIG. 1 and the example illustrated in FIG. 3, the method proceeds to step 202, where a plurality of source/drain portions 13 are respectively formed in the recessed fin portions 521. In some embodiments, two or more adjacent ones of the source/drain portions 13 may be merged to form a merged portion 13A according to designs. For instance, as shown in FIG. 5, two of the source/drain portions 13 are merged to form a diamond-like shape structure, and two merged portions 13A shown in FIG. 3 are formed at two opposite sides of the dummy portion 53. Please note that each of the merged portions 13A (including a plurality of the source/drain portions 13) may also be referred to as a source/drain portion.

In some embodiments, each of the source/drain portions 13 may include multiple epitaxial layers, each may include silicon, silicon germanium, silicon carbide, germanium, III-V compound semiconductors, or combinations thereof. Other suitable materials for the epitaxial layers are within the contemplated scope of the present disclosure. For an n-FET device, each of the epitaxial layers may be doped with an n-type impurity, for example, but not limited to, phosphorus. For a p-FET device, each of the epitaxial layers may be doped with a p-type impurity, for example, but not limited to, boron. The semiconductor epitaxial layer may include silicon, silicon germanium, silicon carbide, germanium, III-V compound semiconductors, or combinations thereof. Other suitable materials for the p-type impurity and/or the n-type impurity are within the contemplated scope of the present disclosure.

Figure 4:
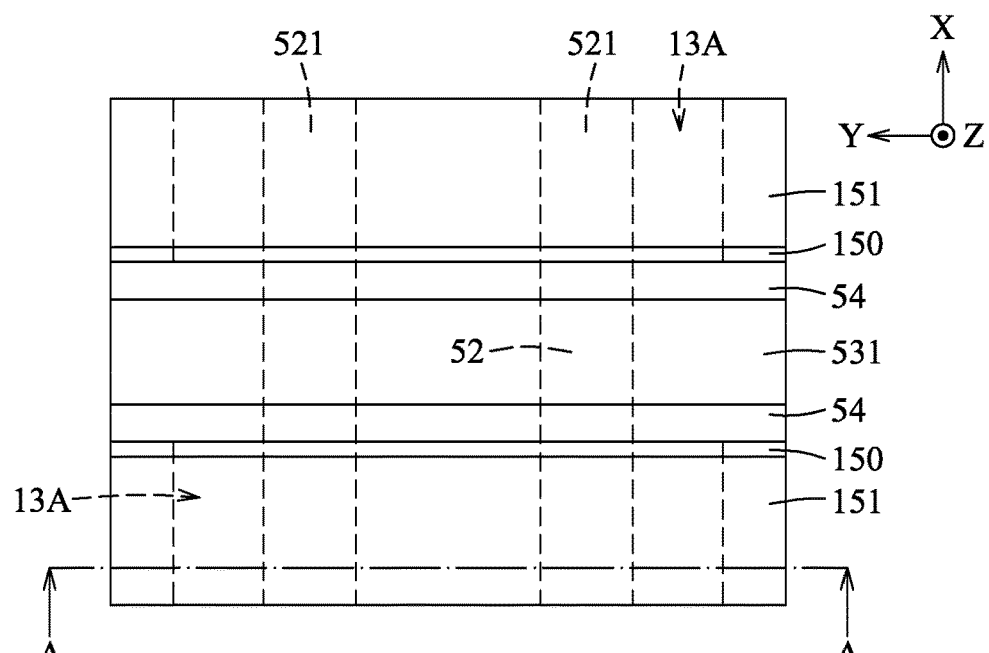

Referring to FIG. 1 and the example illustrated in FIG. 4, the method proceeds to step 203, where a contact etch stop layer (CESL) 150 and a dielectric layer 151 are sequentially formed over the structure shown in FIG. 3. In some embodiments, the dielectric layer 151 is known as the interlayer dielectric (ILD) layer. FIG. 5 is a cross sectional view taken along line A-A of the structure shown in FIG. 4. In FIG. 5, some elements, such as the CESL 150, the fin side walls 520, and so on, are not shown for the sake of clarity. In some embodiments, step 203 is performed by sequentially depositing the CESL 150 and the dielectric layer 151 using a blanket deposition process, such as, but not limited to, chemical vapor deposition (CVD), high density plasma CVD (HDPCVD), sub-atmospheric CVD (SACVD), or molecular layer deposition (MLD), followed by a planarization process, for example, but not limited to, CMP, thereby exposing the dummy gate 531. In other words, the hard mask 530 shown in FIG. 3 is removed after step 203. Other suitable processes for forming the CESL 150 and the dielectric layer 151 are within the contemplated scope of the present disclosure.

In some embodiments, the CESL 150 includes, for example, but not limited to, silicon nitride, carbon-doped silicon nitride, other suitable materials, or combinations thereof. The dielectric layer 151 includes a dielectric material such as, but not limited to, silicon oxide, silicon nitride, silicon oxynitride, other suitable materials, or combinations thereof. Other suitable materials for forming the CESL 150 and the dielectric layer 151 are within the contemplated scope of the present disclosure.

Figure 6:
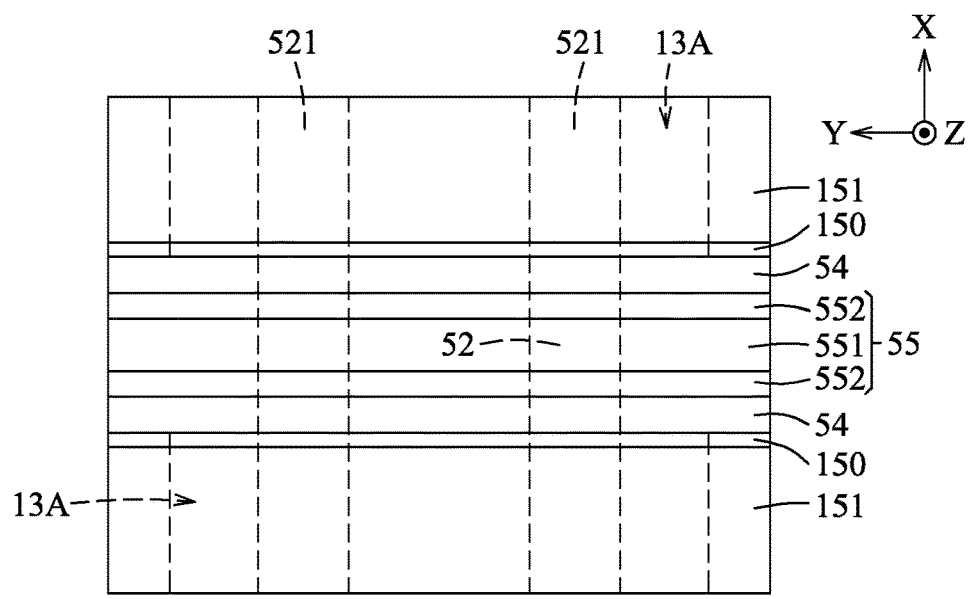

Referring to FIG. 1 and the example illustrated in FIG. 6, the method proceeds to step 204, where a replacement gate (RPG) process is performed to replace the remaining of the dummy portion 53 (i.e., the dummy gate 531 and the dummy dielectric) with a gate portion 55 which includes a gate electrode 551 and a gate dielectric 552. In some embodiments, step 204 includes (i) removing the dummy gate 531 and the dummy dielectric to form a trench (not shown) using dry etching, wet etching, other suitable processes, or combinations thereof, (ii) sequentially depositing layers of the gate dielectric 552 and the gate electrode 551 to fill the trench by a blanket deposition process, such as CVD, HDPCVD, SACVD, MLD, or physical vapor deposition (PVD), and (iii) performing a planarization process, for example, but not limited to, CMP, to remove excesses of the gate electrode 551 and the gate dielectric 552 and to expose the dielectric layer 151. Other suitable processes for forming the gate portion 55 are within the contemplated scope of the present disclosure.

In some embodiments, the gate dielectric 552 includes silicon oxide, silicon nitride, silicon oxynitride, high dielectric constant (k) materials, other suitable materials, or combinations thereof, and the gate electrode 551 includes aluminum, tungsten, copper, other suitable materials, or combinations thereof. Other suitable materials for forming the gate portion 55 are within the contemplated scope of the present disclosure.

Figure 7:
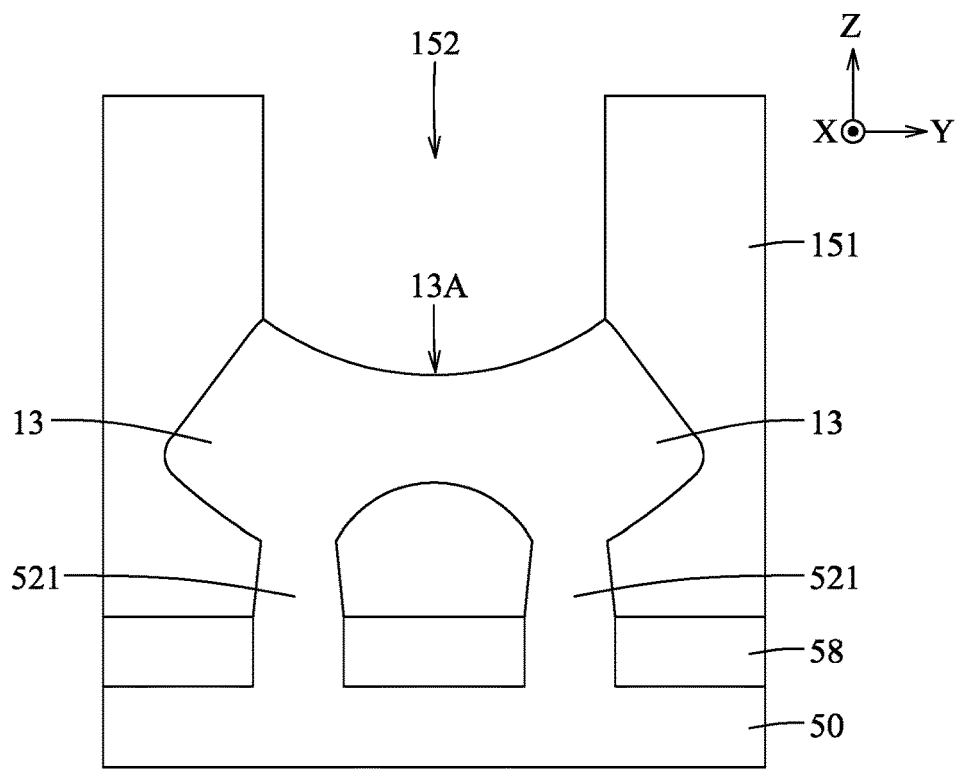

Referring to FIG. 1 and the example illustrated in FIG. 7, the method proceeds to step 205, where a plurality of trenches 152 (one of which is shown) are formed in the dielectric layer 151. FIG. 7 is a view similar to that of FIG. 5, but illustrating the structure after completing step 205. For better understanding, FIGS. 8 to 12, 14, 16, 18 and 19 illustrate structures subsequent to the structure shown in FIG. 7 (i.e., after step 205).

Each of the trenches 152 extends through the dielectric layer 151 and the CESL 150 to expose a corresponding one of the source/drain portions 13A. In some embodiments, step 205 includes (i) forming a patterned mask layer (not shown) to cover a top surface of the structure shown in FIG. 6, the patterned mask layer being a patterned photoresist or a patterned hard mask and having openings in positions respectively corresponding to the source/drain portions 13A, (ii) etching the dielectric layer 151 and the CESL 150 through the openings of the patterned mask layer using dry etching, wet etching, other suitable processes, or combinations thereof, to form the trenches 152 until the source/drain portions 13A are exposed from the trenches 152, and (iii) removing the patterned mask layer. Other suitable processes for forming the trenches 152 are within the contemplated scope of the present disclosure.

Figure 8:
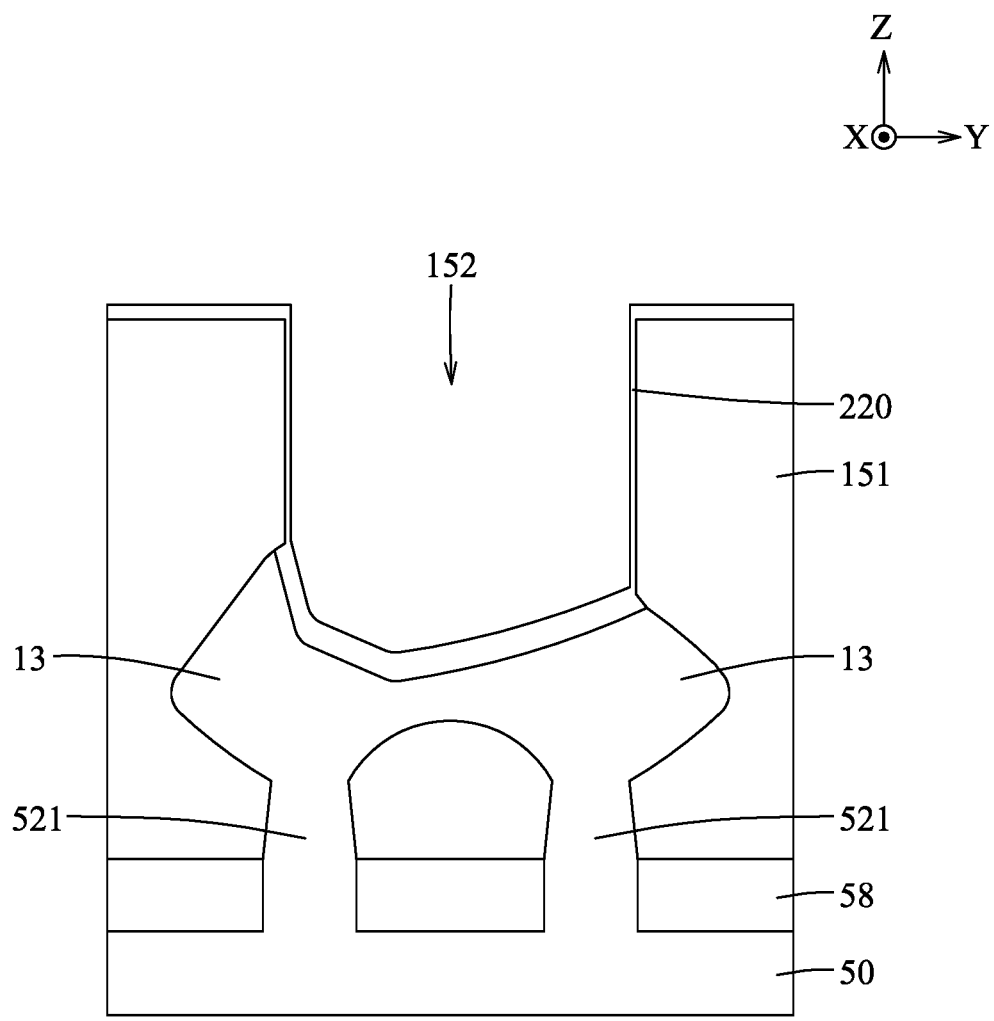

Referring to FIG. 1 and the example illustrated in FIG. 8, the method proceeds to step 206, where a silicide layer 220 is formed over the dielectric layer 151 and in the trenches 152 covering a trench sidewall and a trench bottom of each of the trenches 152. The silicide layer 220 may include silicon and at least one metallic element, for example, but not limited to, titanium (Ti), nickel (Ni), other suitable materials, or combinations thereof. Other suitable materials for forming the silicide layer 220 are within the contemplated scope of the present disclosure. The silicide layer 220 may be formed by any suitable processes. In some embodiments, the silicide layer 220 formed on the trench bottom may have a thickness larger than that of the silicide layer 220 formed on the trench sidewall. This is to facilitate step 213 to be performed subsequently, and will be discussed hereinafter.

Figure 9:
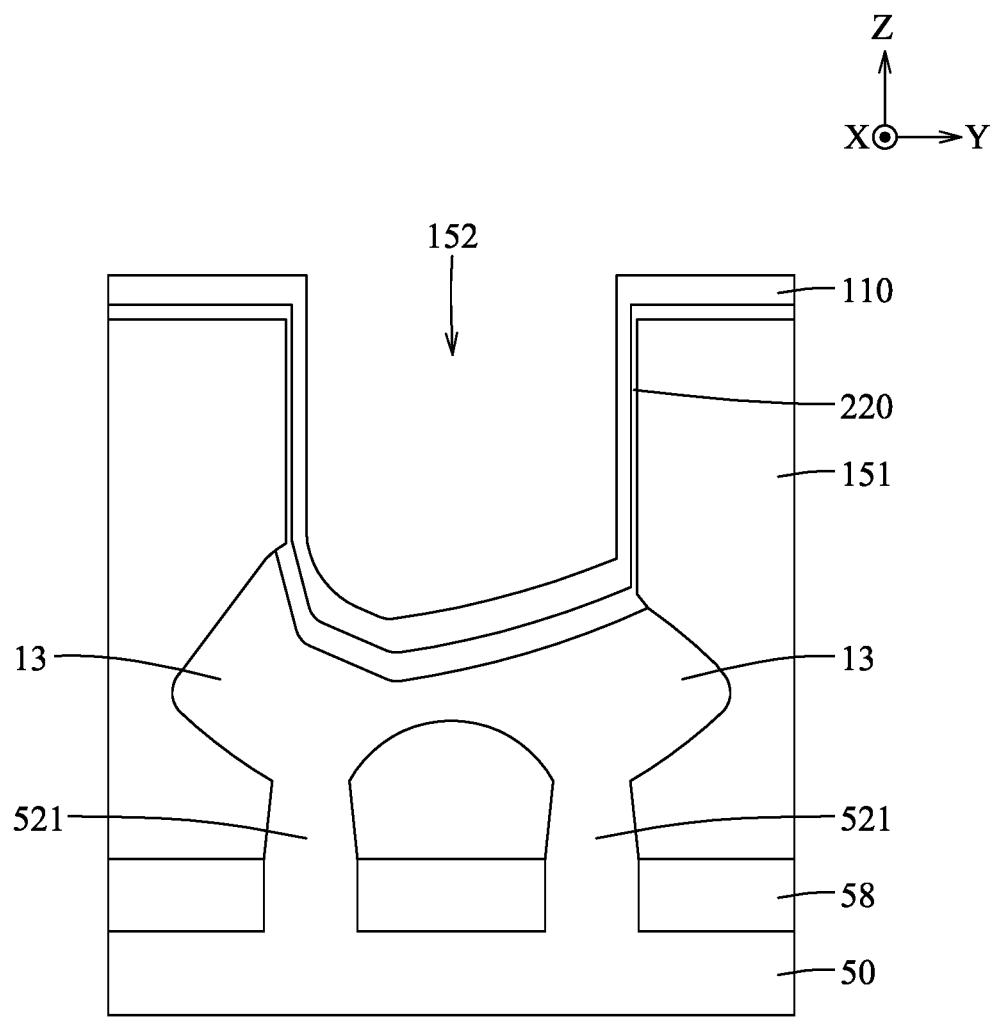

Referring to FIG. 1 and the example illustrated in FIG. 9, the method proceeds to step 207, where a first metallic layer 110, which is a metal-including layer, is formed over the semiconductor substrate 50 in the trenches 152 and covers the silicide layer 220. The first metallic layer 110 includes at least one of tungsten, tungsten nitride, aluminum oxide, titanium nitride, aluminum, tantalum nitride, cobalt, titanium, tantalum, nickel, molybdenum, copper, and the like. Other suitable materials for forming the first metallic layer 110 are within the contemplated scope of the present disclosure. The first metallic layer 110 may be formed by, for instance, PVD. Other suitable processes for forming the first metallic layer 110 are within the contemplated scope of the present disclosure. It is noted that the first metallic layer 110 has a hydrophilic surface, which in some cases, includes an oxide or hydroxide of the metal present therein. In some embodiments, the first metallic layer 110 formed on the trench bottom may have a thickness larger than that of the first metallic layer formed on the trench sidewall. This is to facilitate step 213 to be performed subsequently, and will be discussed hereinafter.

Figure 10:
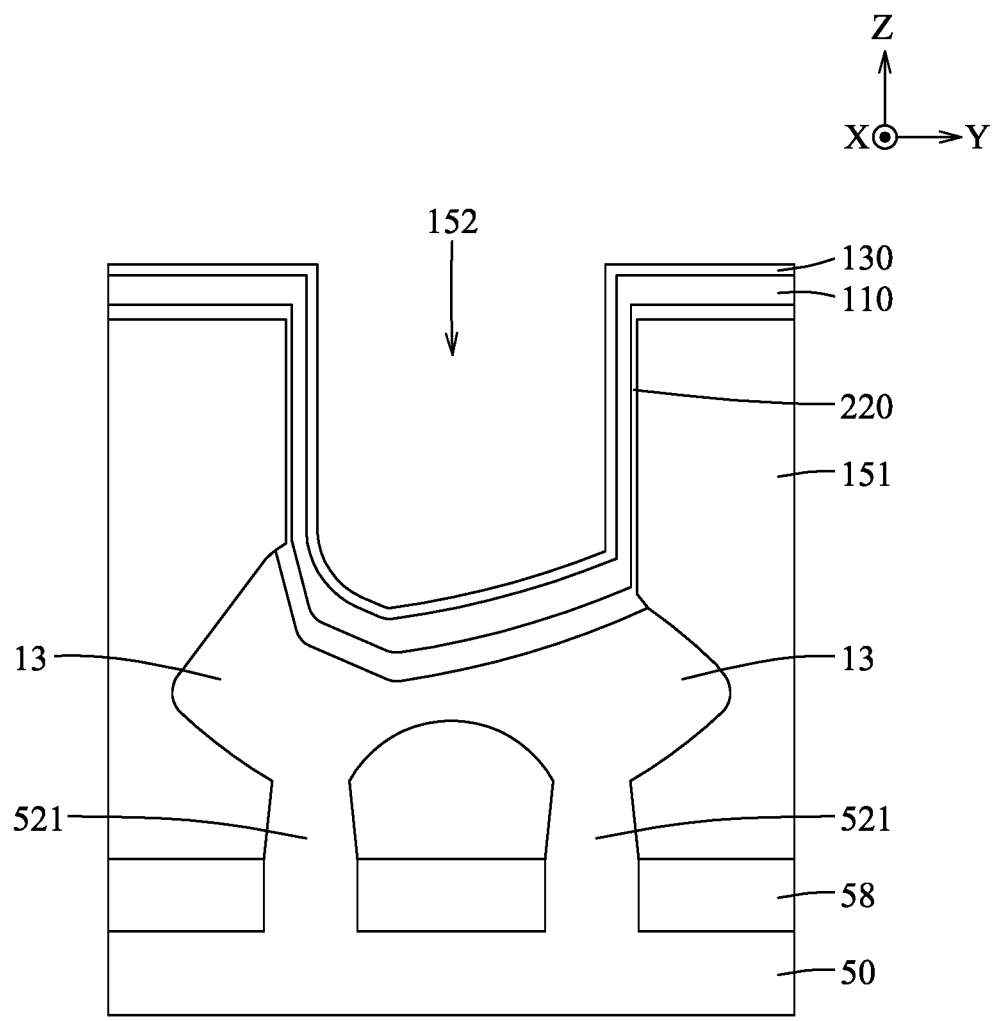

Referring to FIG. 1 and the example illustrated in FIG. 10, the method proceeds to step 208, where the first metallic layer 110 is subjected to a modification process. In some embodiments, the modification process is performed by forming an amphiphilic polymer layer 130 over the first metallic layer 110. Step 208 may include the following substeps: (i) forming a solution including an amphiphilic polymer material; (ii) applying the solution over the first metallic layer 110; and (iii) performing a drying process so as to obtain the amphiphilic polymer layer 130 including the amphiphilic polymer material. In substep (i), the solution may be formed by dissolving the amphiphilic polymer material in a suitable organic solvent (determined according to practical needs). In substep (ii), in some embodiments, the solution may be applied by, for instance, evenly spraying over the first metallic layer 110 at a suitable temperature, for instance but not limited to, room temperature (about 25° C. to about 40° C.). In substep (iii), the drying process may include, but not limited to, air drying, thereby forming the amphiphilic polymer layer 130. The formation of the amphiphilic polymer layer 130 generally does not require any heating (may be adjusted according to practical needs), and makes it easy to modify the first metallic layer 110. Other suitable processes for forming the amphiphilic polymer layer 130 are within the contemplated scope of the present disclosure.

Figure 13:
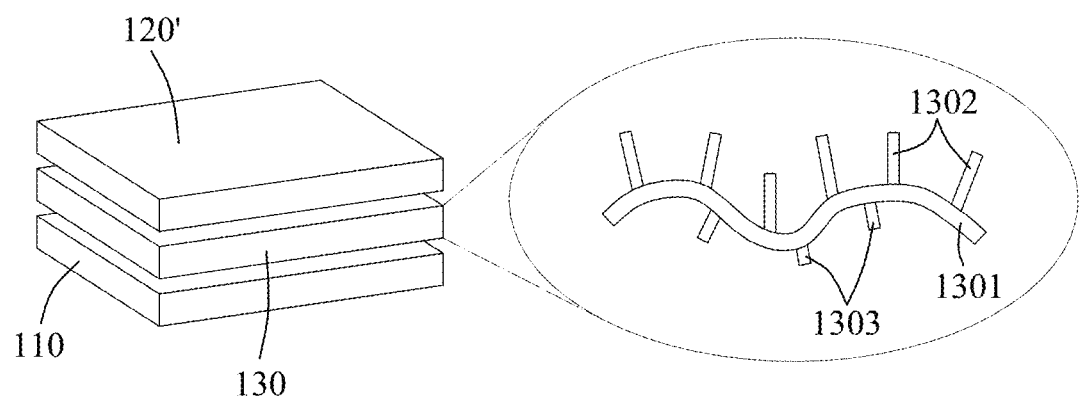

In some embodiments, the amphiphilic polymer material for forming the amphiphilic polymer layer 130 includes a polymer backbone 1301, hydrophobic groups 1302 attached to the polymer backbone 1301, and hydrophilic groups 1303 attached to the polymer backbone 1301 (see FIG. 13). A number of the hydrophobic groups 1302 is greater than that of the hydrophilic groups 1303. The amphiphilic polymer layer 130 may be present as a self-assembled monolayer (SAM).

In some embodiments, the hydrophobic groups 1302 each independently is a saturated alkyl, a phenyl, or the likes. For hydrophobic groups 1302 that are saturated alkyl, a number of carbon atom may range from one to three. That is, each of the hydrophobic groups 1302 may be a short saturated alkyl chain. Such short alkyl chain may avoid undesired aggregation of the alkyl chain as occurred in long alkyl chain. In addition, the saturated alkyl is relatively unreactive compared to unsaturated hydrocarbons such as alkenyl or alkynl, which is conducive to avoiding reactions with any other species. Example of the phenyl may include, but not limited to, benzene, which is also considered as an unreactive species. Other suitable materials for forming the hydrophobic groups 1302 are within the contemplated scope of the present disclosure. The hydrophobic groups 1302 may be bonded to other species by van Der Waals force. In some embodiments, the hydrophobic groups 1302 are evenly distributed along the polymer backbone 1301.

In some embodiments, the hydrophilic groups 1303 each independently is hydroxyl, carboxyl, amide or amino. Other suitable materials for forming the hydrophilic groups 1303 are within the contemplated scope of the present disclosure. The hydrophilic groups 1303 may be bonded to other species by hydrogen bond.

Figure 11:
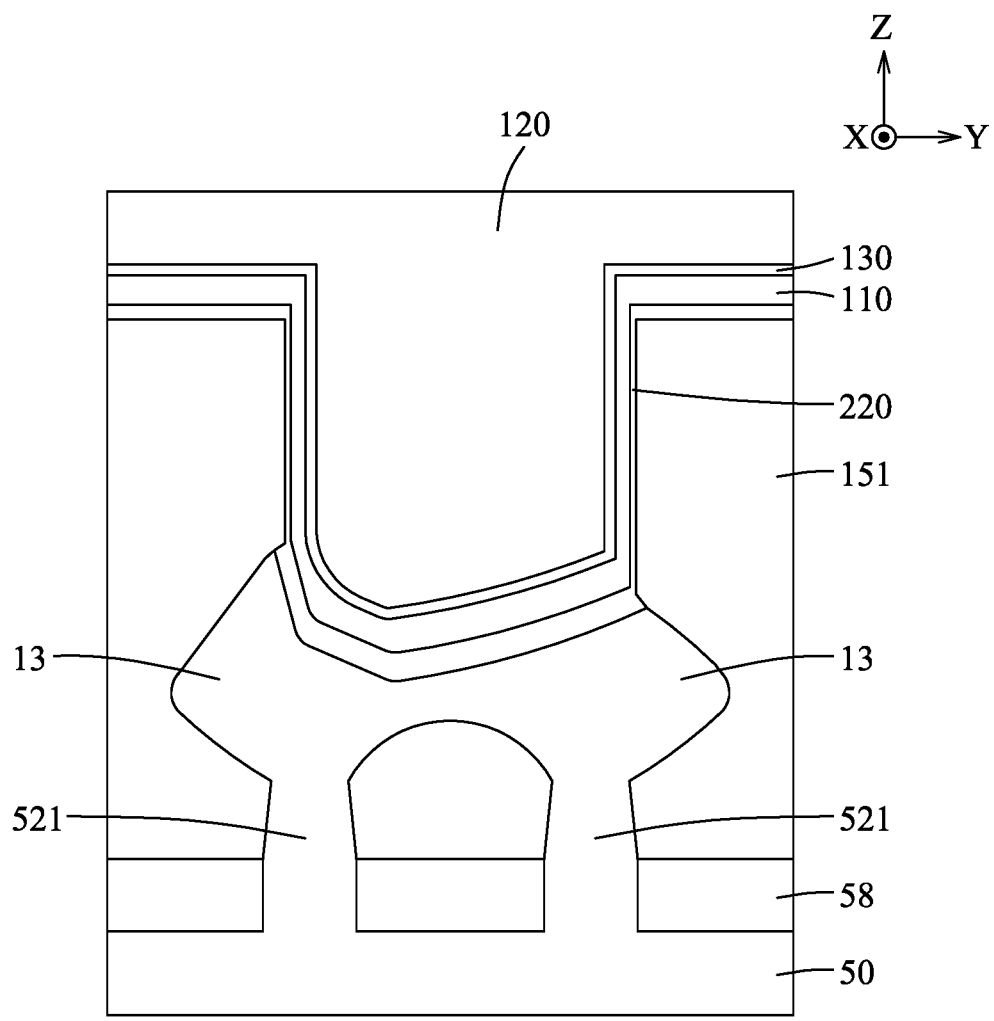

Referring to FIG. 1 and the example illustrated in FIG. 11, the method proceeds to step 209, where a hydrophobic polymer layer 120 is formed over the amphiphilic polymer layer 130.

In some embodiments, the hydrophobic polymer layer 120 includes a bottom anti-reflective coating (BARC) material. BARC is a porous polymer prepared from, for example, but not limited to, styrene monomers and epoxy cross-linkers, and is relatively hydrophobic compared to the first metallic layer 110. Other suitable materials for forming the hydrophobic polymer layer 120 are within the contemplated scope of the present disclosure.

Figure 12:
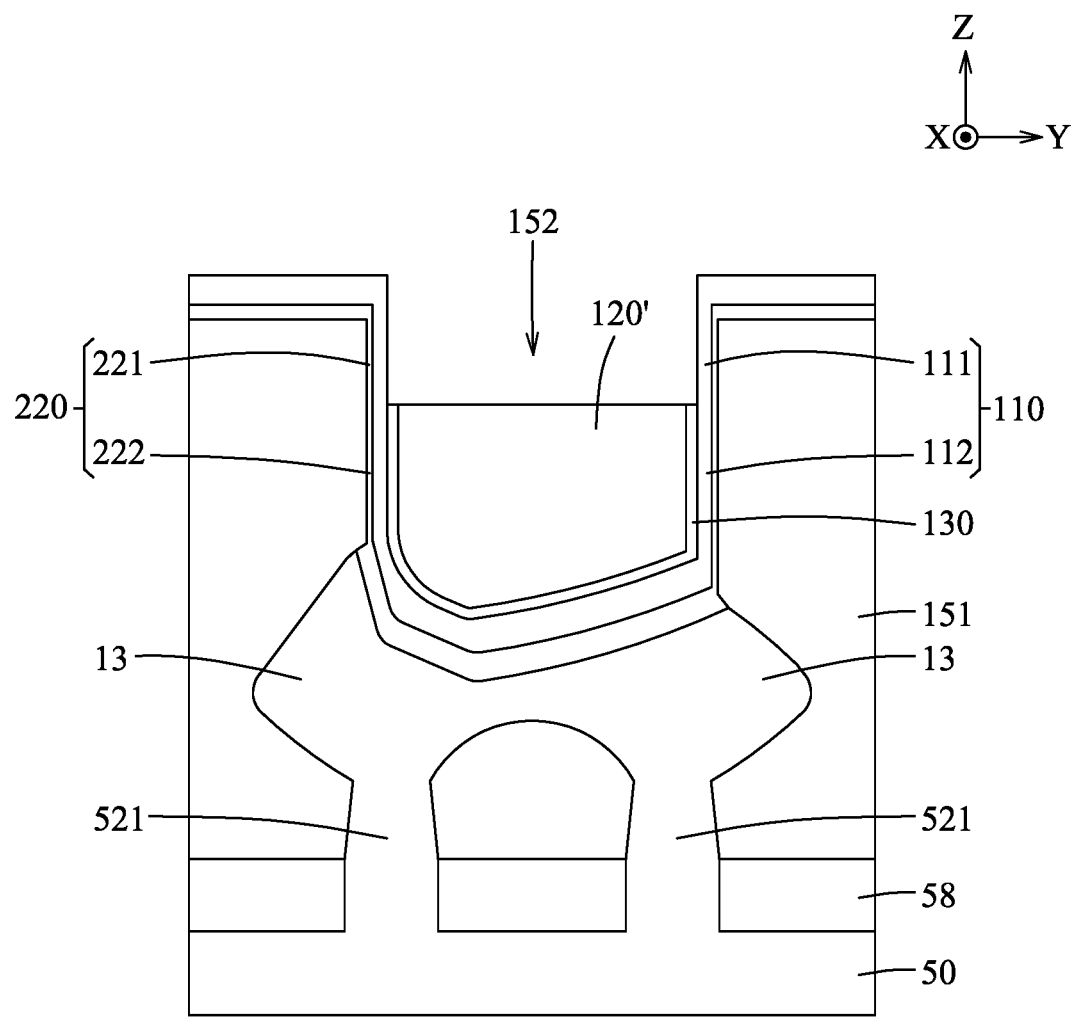

Referring to FIG. 1 and the example illustrated in FIG. 12, the method proceeds to step 210, where an upper portion of the hydrophobic polymer layer 120 is removed, and a remaining lower portion of the hydrophobic polymer layer 120 is denoted by the numeral 120'. The hydrophobic polymer layer 120' covers a second portion 112 of the first metallic layer 110, leaving a first portion 111 of the first metallic layer 110 being exposed from the hydrophobic polymer layer 120. In addition, the silicide layer 220 has a first portion 221 located beneath the first portion 111 of the first metallic layer 110, and a second portion 222 located beneath the second portion 112 of the first metallic layer 110. The upper portion of the hydrophobic polymer layer 120 may be removed by, for instance, an etching process using any suitable etchants which have a high etch selectivity for the hydrophobic polymer layer 120 relative to the first metallic layer 110. Other suitable processes for removing the hydrophobic polymer layer 120 are within the contemplated scope of the present disclosure.

FIG. 13 is a schematic diagram demonstrating the role of the amphiphilic polymer layer 130 formed between the hydrophobic polymer layer 120' and the first metallic layer 110. A surface of the amphiphilic polymer layer 130 that confronts the first metallic layer 110 is hydrophilic, and the hydrophilic groups 1303 of the amphiphilic polymer layer 130 may form hydrogen bond with the metal oxide and/—or metal hydroxide, or the likes located on the hydrophilic surface of first metallic layer 110, leaving the hydrophobic groups 1302 of the amphiphilic polymer layer 130 opposite to the first metallic layer 110. As such, the amphiphilic polymer layer 130 permits a hydrophobic surface to be formed over the first metallic layer 110. In addition, a surface of the amphiphilic polymer layer 130 that confronts the hydrophobic polymer layer 120' is hydrophobic, and the hydrophobic groups 1302 of the amphiphilic polymer layer 130 may be bonded to the styrene molecules by van der Waal force in the case of the hydrophobic polymer layer 120' being made of BARC. As such, the amphiphilic polymer layer 130 is capable of simultaneously bonding to both the hydrophobic polymer layer 120' and the first metallic layer 110, thus enhancing a bonding force between the first metallic layer 110 and the hydrophobic polymer layer 120'.

Figure 14:
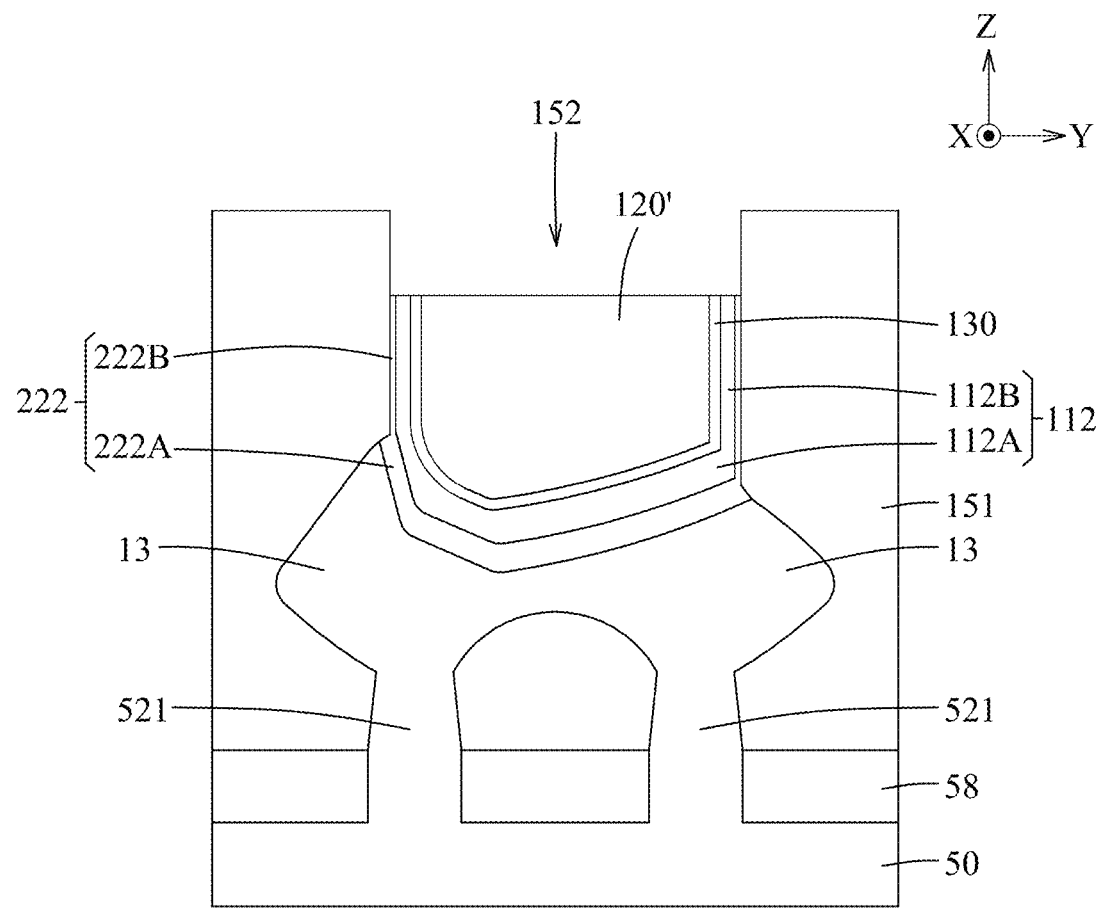

Referring to FIG. 1 and the examples illustrated in FIGS. 12 and 14, the method proceeds to step 211, where the first portion 111 of the first metallic layer 110 and the first portion 221 of the silicide layer 220 are removed, leaving the second portion 112 of the first metallic layer 110 and the second portion 222 of the silicide layer 220. The second portion 112 of the first metallic layer 110 has a sidewall region 112B located on the trench sidewall, and a bottom region 112A located on the trench bottom. The second portion 222 of the silicide layer 220 has a sidewall region 222B located on the trench sidewall, and a bottom region 222A located on the trench bottom.

Figure 15:
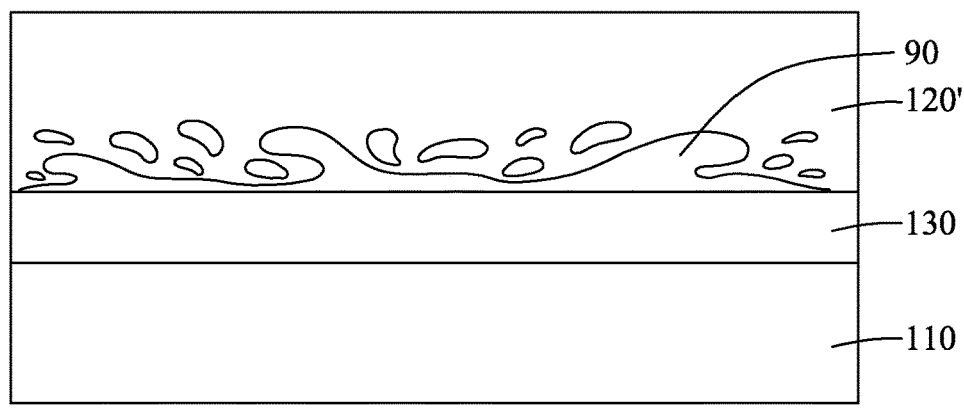

In some embodiments, the removal of the first portions 111, 221 of the first metallic layer 110 and the silicide layer 220 is performed by wet etching using any suitable wet etchant which has a high etching selectivity for the first metallic layer 110 and the silicide layer 220 relative to the other elements, such as the dielectric layer 151. Step 211 also aims to retain the second portion 112 of the first metallic layer 110, however, considering the hydrophobic polymer layer 120' being a porous layer, the wet etchant may pass through the hydrophobic polymer layer 120' and reach the second portion 112 of the first metallic layer 110. In the case of omitting the amphiphilic polymer layer 130, the wet etchant may unintentionally etch away the second portions 112, 222 of the first metallic layer 110 and the silicide layer 220. Referring to FIG. 15, by including the amphiphilic polymer layer 130, the wet etchant (denoted by the numeral 90) will first reach the amphiphilic polymer layer 130 after passing through the hydrophobic polymer layer 120'. Since the surface of the amphiphilic polymer layer 130 that confronts the hydrophobic polymer layer 120' is hydrophobic, the amphiphilic polymer layer 130 may serve as a waterproof layer to hinder, or slow down, the wet etchants 90 from reaching and undesirably damaging the second portion 112 of the first metallic layer 110. That is, the first metallic layer 110 covered by the amphiphilic polymer layer 130, i.e., the modified first metallic layer 110, exhibits improved chemical resistance to wet etchants. For instance, in a peeling test to evaluate a resisting time period for the first metallic layer 110 to be observed with bubble defect when a wet etchant (for example, an etchant for a standard clean or a RCA clean) is applied thereon (indicating that the wet etchant penetrates through the hydrophobic polymer layer 120' and damages the first metallic layer 110), a sample that includes the amphiphilic polymer layer 130 between the first metallic layer 110 and the hydrophobic polymer layer 120' may have a resisting time period much longer than a sample without the amphiphilic polymer layer 130. For example, but not limited to, the resisting time period of the sample with the amphiphilic polymer layer 130 may be approximately 1.5 times to 2.5 times of that of the sample without the amphiphilic polymer layer 130.

Figure 16:
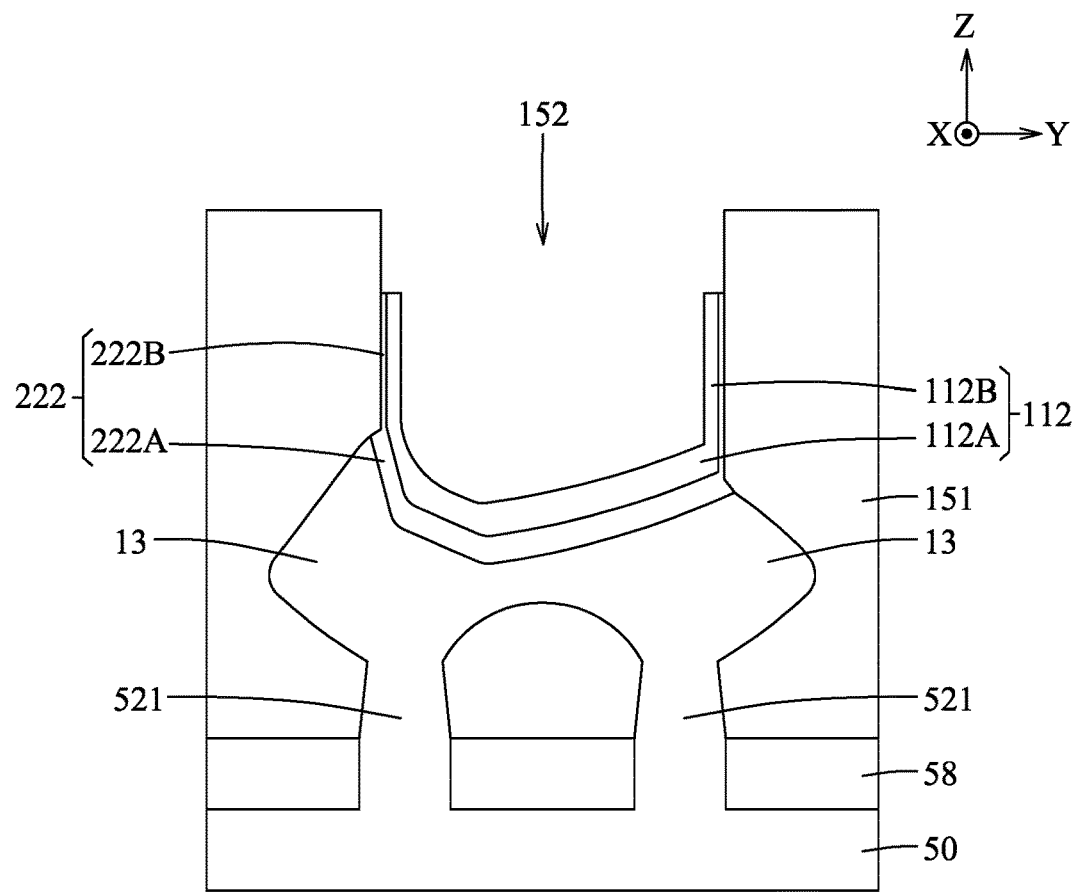

Referring to FIG. 1 and the example illustrated in FIG. 16, the method proceeds to step 212, where the hydrophobic polymer layer 120' is removed by, for example but not limited to, an ashing process. Other suitable processes for removing the hydrophobic polymer layer 120' are within the contemplated scope of the present disclosure.

Figure 17:
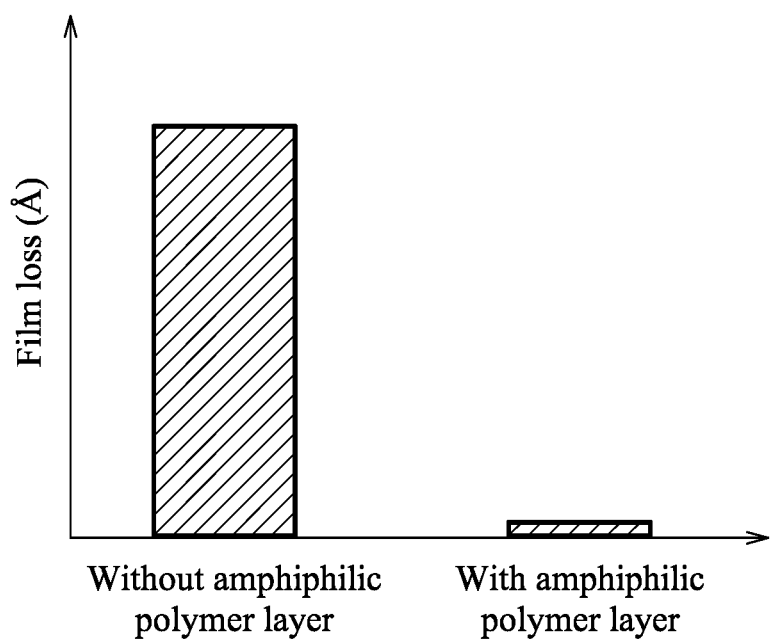
FIG. 17 is a diagram illustrating bottom film loss with and without amphiphilic polymer layer in accordance with some embodiments.

Considering that step 211 aims to remove the first portion 111, and to retain the second portion 112 of the first metallic layer 110, an experiment is performed to evaluate film loss of the first metallic layer 110. FIG. 17 is a graph showing film loss of the bottom region 112A of the first metallic layer 110 with and without inclusion of the amphiphilic polymer layer 130 in accordance with some embodiments of the present disclosure. Film loss refers to a thickness of the bottom region 112A of the first metallic layer 110 that is etched away by the wet etchant used in step 211. The results show that the film loss of the bottom region 112A after step 211 may be effectively reduced with the presence of the amphiphilic polymer layer 130. This suggests that the amphiphilic polymer layer 130 may avoid or slow down penetration of the wet etchant to the second portion 112 of the first metallic layer 110, and is beneficial to permit the bottom region 112A of the first metallic layer 110 to remain intact, so as to facilitate subsequent steps.

Figure 18:
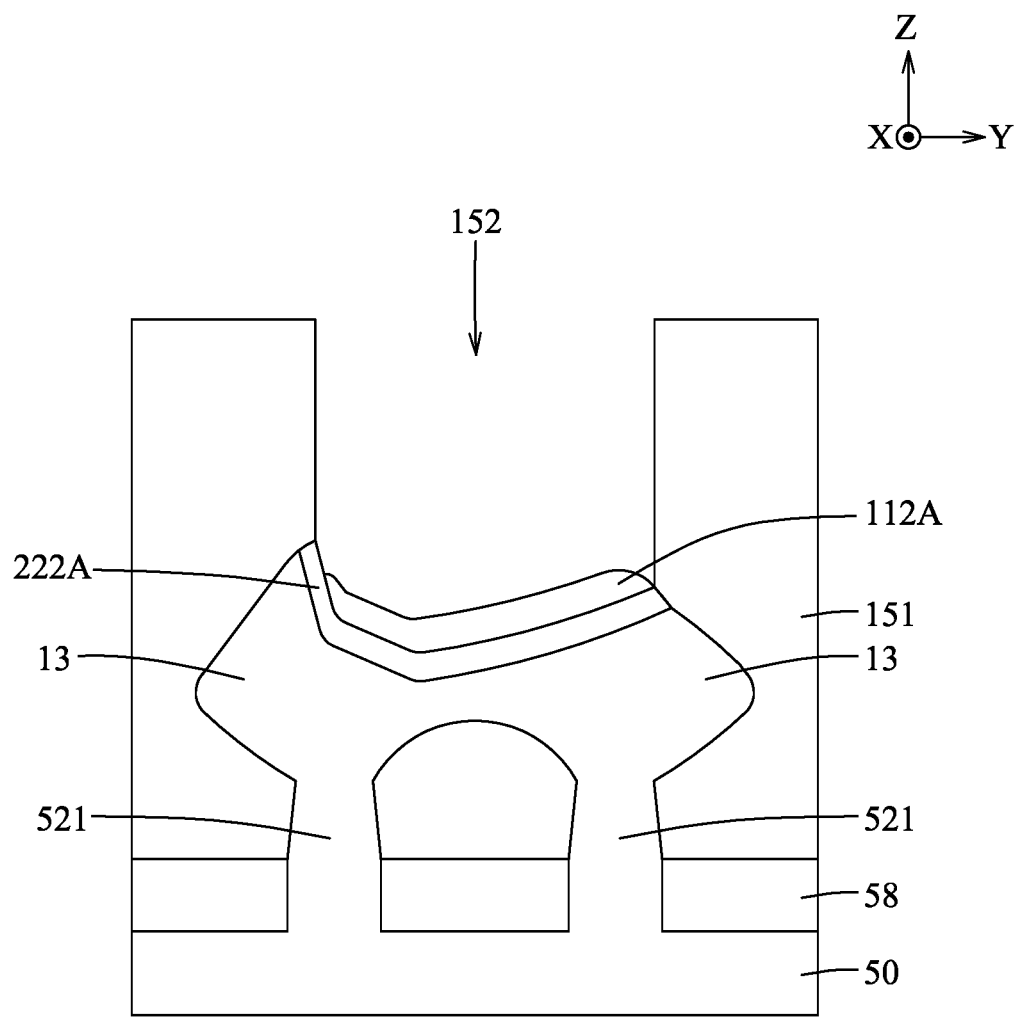

Referring to FIG. 1 and the examples illustrated in FIGS. 16 and 18, the method proceeds to step 213, where the second portions 112, 222 of the first metallic layer 110 and the silicide layer 220 are partially removed such that the sidewall region 112B of the first metallic layer 110 and the sidewall region 222B of the silicide layer 220 are removed while the bottom region 112A of the first metallic layer 110 and the bottom region 222A of the silicide layer 220 remain.

In some embodiments, step 213 may be performed by any suitable etching process, such as an isotropic etching process which has substantially same etching selectivity and etching rate over each of the first metallic layer 110 and the silicide layer 220 formed on the trench bottom, i.e., the bottom regions 112A, 222A, and on the trench sidewall, i.e., the sidewall regions 112B, 222B. In such case, by forming the bottom regions 112A, 222A thicker than the sidewall regions 112B, 222B, the sidewall regions 112B, 222B may be completely removed in step 213, while a sufficient thickness of each of the bottom regions 112A, 222A may be retained, so as to facilitate step 214 to be performed subsequently. Any other suitable processes for removing the sidewall region 112B of the first metallic layer 110 and the sidewall region 222B of the silicide layer 220 are within the contemplated scope of the present disclosure.

Figure 19:
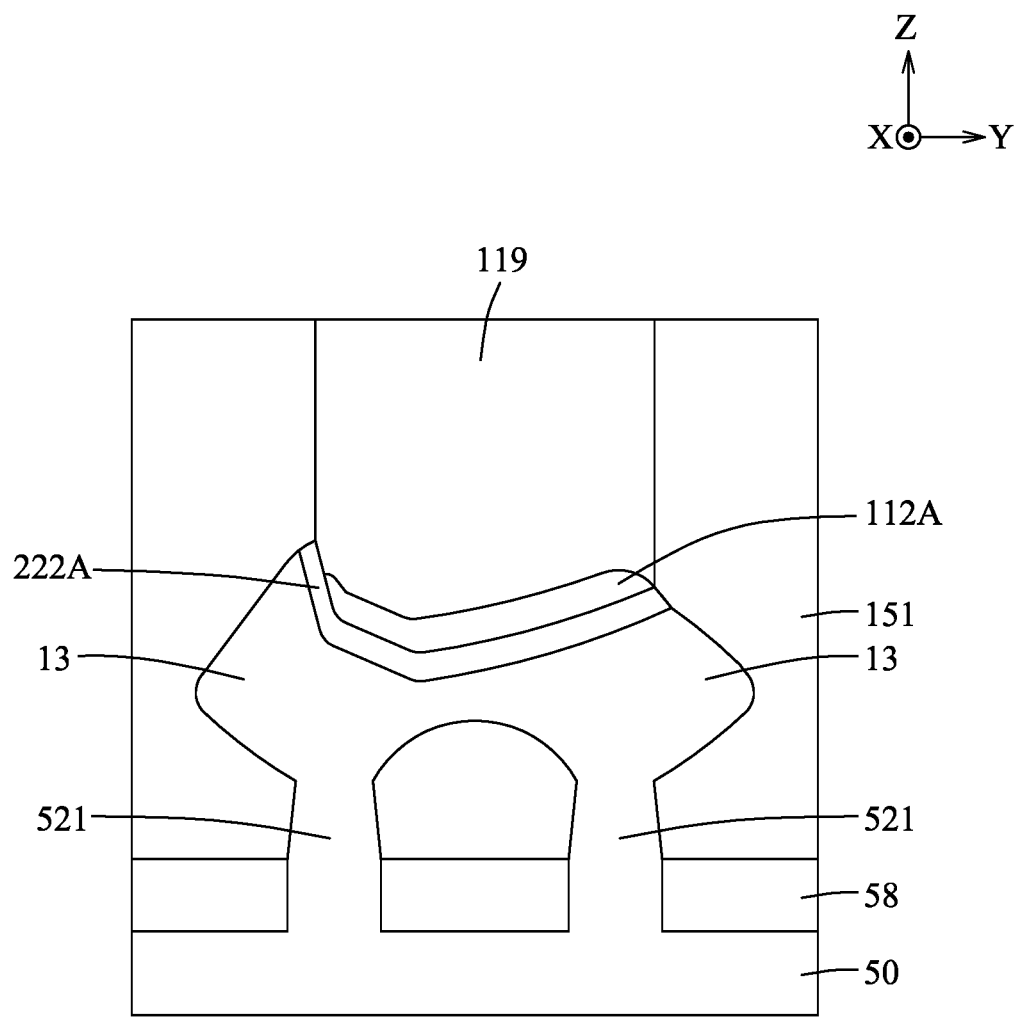

Referring to FIG. 1 and the example illustrated in FIG. 19, the method proceeds to step 214, where a second metallic layer 119 is formed on the remaining bottom region 112A of the first metallic layer 110.

Step 214 may include sub-steps of: (i) filling a second metallic material in the trench 152 by, for example, but not limited to, a CVD process, or any other suitable processes, and (ii) planarizing (by e.g., CMP) the second metal-including material to remove an excess thereof, thereby obtaining the second metallic layer 119. The second metallic material is used to form the second metallic layer 119, and may include, for example, tungsten. Other suitable materials and processing for forming the second metallic layer 119 are within the contemplated scope of the present disclosure.

It is noted that in some embodiments, in sub-step (i), the second metallic material (made of, e.g., tungsten) growing on merely the bottom region 112A of the first metallic layer 110 (made of, e.g., another form of tungsten) has improved growth performance than directly growing on both the sidewall region 112B and the bottom region 112A, and is beneficial for obtaining a semiconductor device with improved electrical properties.

In some embodiments, the second metallic layer 119 may serve as a "metal-to-device (MD) contact", i.e., contact to conductive region of the semiconductor device such as the source/drain portions.

It should be noted that some steps in the method may be modified, replaced, or eliminated without departure from the spirit and scope of the present disclosure, and those steps may not be in the order mentioned above. In alternative embodiments, other suitable methods may also be applied for forming the semiconductor device.

Figure 20:
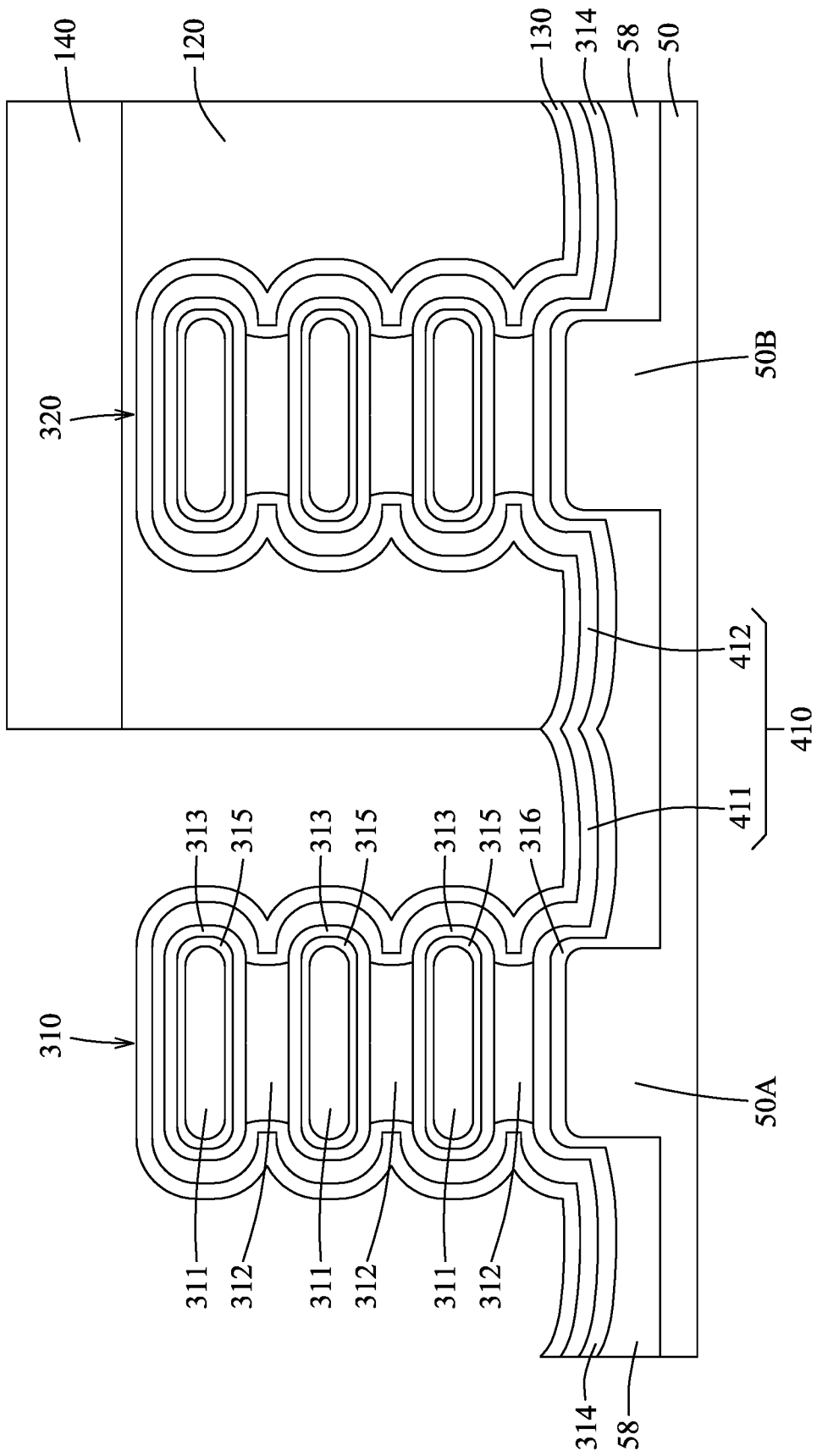
FIG. 20 is a schematic view illustrating an intermediate stage of the method for manufacturing another semiconductor device in accordance with some embodiments.

For example, step 208, which involves modifying the first metallic layer (i.e., metal-including layer 110) by forming an amphiphilic polymer layer 130 thereon, as mentioned in the exemplary embodiment above, permits the metal-including layer 110 to have improved adhesion with the hydrophobic polymer layer 120 including, e.g., BARC, and may also be applied in any other suitable manufacturing methods of semiconductor devices involving application of the hydrophobic polymer layer 120, e.g., but not limited to, BARC, over the metal-including layer 110. FIG. 20 is a schematic diagram illustrating an intermediate step of another exemplary embodiment of a method for manufacturing another semiconductor device, e.g., a GAA nanosheet FET, in which a step of patterning a portion of a metal-including layer 410 is shown, and which involves the formation of the amphiphilic polymer layer 130 between the metal-including layer 410 and the hydrophobic polymer layer 120.

As shown in FIG. 20, a first nanounit 310 is formed on a first region 50A of a semiconductor substrate 50, and a second nanounit 320 is formed on a second region 50B of the semiconductor substrate 50. The metal-including layer 410 is formed over the semiconductor substrate 50, and includes a first portion 411 covering the first nanounit 310, and a second portion 412 covering the second nanounit 320. In some embodiments, the first nanounit 310 is a portion of an n-type device, and the second nanounit 320 is a portion of a p-type device, or vice versa. Each of the first and second nanounits 310, 320 includes a plurality of nanosheets 311 which are spaced apart from each other, a plurality of metal plugs 312 which are disposed to alternate with the nanosheets 311, a plurality of first gate dielectric portions 313 which respectively surround the nanosheets 311 to separate the nanosheets 311 from the metal plugs 312, and a second gate dielectric portion 314 disposed between each of first and second portions 411, 412 of the metal-including layer 410 and a corresponding one of the first and second regions 50A, 50B of the semiconductor substrate 50. In some embodiments, the metal-including layer 410 may serve as a work function metal for the second nanounit 320 on the second region 50B of the semiconductor substrate 50, and may include titanium nitride (TiN), tungsten nitride (WN), or combinations thereof. In some embodiments, each of the nanosheets 311 includes a semiconductor material, such as silicon, and the first gate dielectric portions 313 and the second gate dielectric portion 314 each may include a material similar to that for the gate dielectric 552 as described above. The metal plugs 312 may include any suitable material serving as a work function metal. In some embodiments, an interfacial layer (IL) 315 is formed between each of the nanosheets 311 and a corresponding one of the first gate dielectric portions 313, and may include, for example, but not limited to, silicon oxide. In addition, a plurality of isolation portions 58 are disposed on the semiconductor substrate 50 to alternate with the first and second regions 50A, 50B, and an additional IL 316 is formed on each of the first and second regions 50A, 50B to interconnect the isolations portions 58 at two opposite sides of a corresponding one of the first and second regions 50A, 50B. The semiconductor substrate 50 (including the first and second regions 50A, 50B) and the isolation portions 58 shown in FIG. 20 may include materials similar to those for the semiconductor substrate 50 and the isolation portions 58 shown in FIG. 5. Other suitable materials for forming each of the first and second nanounits 310, 320 and the metal-including layer 410 are within the contemplated scope of the present disclosure.

The metal-including layer 410 is modified by forming an amphiphilic polymer layer 130 over the metal-including layer 410 using an amphiphilic polymer material. Details of the formation of the amphiphilic polymer layer 130 is similar to that of step 208 as described in the exemplary embodiment (i.e., for forming the FinFET), and are omitted herein for the sake of brevity.

A hydrophobic polymer layer 120 is formed to cover the second portion 412 of the metal-including layer 410, leaving the first portion 411 exposed from the hydrophobic polymer layer 120. The hydrophobic polymer layer 120 may be similar to that described in step 209, and may include a BARC material. The hydrophobic polymer layer 120 and a hard mask layer 140 formed thereon may be formed by (i) forming a hydrophobic polymer material (not shown, for forming the hydrophobic polymer layer 120) over the semiconductor substrate 50 to cover the first and second nanounits 310, 320, (ii) forming a hard mask material (not shown, for forming the hard mask layer 140) on the hydrophobic polymer material, (iii) forming a patterned photoresist layer (not shown) on the hard mask material to expose the hard mask material on the first region 50A of the semiconductor substrate 50, (iv) partially removing the hydrophobic polymer material and the hard mask material exposed from the patterned photoresist layer so that the hydrophobic polymer material is patterned into the hydrophobic polymer layer 120 and the hard mask material is patterned into the hard mask layer 140, and (v) removing the patterned photoresist layer. The patterned hard mask layer 140 may include aluminum oxide. Other suitable materials and processes for forming the hydrophobic polymer layer 120 and/or the hard mask layer 140 are within the contemplated scope of the present disclosure.

The first portion 411 of the metal-including layer 410 is removed by, for example, but not limited to, wet etching using any suitable wet etchants. This step aims to remove merely the first portion 411 of the metal-including layer 410, and to retain the second portion 412. In the case of omitting the step of modifying the metal-including layer 410, the wet etchant may pass through the hydrophobic polymer layer 120 and undesirably damaging the second portion 412. In the case of including the step of modifying the metal-including layer 410, the hydrophobic polymer layer 120 may have improved adhesion to the metal-including layer 410, while the amphiphilic polymer layer 130 provides a hydrophobic surface to hinder or slow down passage of the wet etchant.

Apart from the application in improving adhesion between a metal-including layer and a hydrophobic polymer layer (e.g., BARC) as described in the present disclosure, such modification of the metal-including layer by forming the amphiphilic polymer layer thereon may also be applied in many other aspects, such as metal surface modification, or selective protection of water sensitive metal films.

The embodiments of the present disclosure have the following advantageous features. By virtue of including the step of modifying the metal-including layer by forming an amphiphilic polymer layer thereon, adhesion between the metal-including layer and the hydrophobic polymer layer is effectively improved. In addition, such modification permits a more hydrophobic surface to be formed over the metal-including layer prior to the modification, so as to have an improved chemical resistance to wet etchants.

In accordance with some embodiments of the present disclosure, a method for manufacturing a semiconductor device includes forming a metal-including layer over a semiconductor substrate; forming a hydrophobic polymer layer over the metal-including layer; and forming an amphiphilic polymer layer between the metal-including layer and the hydrophobic polymer layer so as to enhance a bonding force therebetween.

In accordance with some embodiments of the present disclosure, the metal-including layer has a hydrophilic surface confronting the amphiphilic polymer layer, and includes at least one of tungsten, tungsten nitride, aluminum oxide, titanium nitride, aluminum, tantalum nitride, cobalt, titanium, tantalum, nickel, molybdenum and copper.

In accordance with some embodiments of the present disclosure, the hydrophobic polymer layer includes a bottom anti-reflective coating material.

In accordance with some embodiments of the present disclosure, the amphiphilic polymer layer includes a polymer backbone, hydrophobic groups attached to the polymer backbone, and hydrophilic groups attached to the polymer backbone. A number of the hydrophobic groups is larger than that of the hydrophilic groups.

In accordance with some embodiments of the present disclosure, the hydrophobic groups each independently is a saturated alkyl, or a phenyl.

In accordance with some embodiments of the present disclosure, a number of carbon atom for the saturated alkyl ranges from one to three.

In accordance with some embodiments of the present disclosure, the hydrophilic groups each independently is hydroxyl, carboxyl, amide or amino.

In accordance with some embodiments of the present disclosure, a surface of the amphiphilic polymer layer that confronts the hydrophobic polymer layer is hydrophobic, and a surface of the amphiphilic polymer layer that confronts the metal-including layer is hydrophilic.

In accordance with some embodiments of the present disclosure, the amphiphilic polymer layer is bonded to the hydrophobic polymer layer by van der Waals force.

In accordance with some embodiments of the present disclosure, the amphiphilic polymer layer is bonded to the metal-including layer by hydrogen bond.

In accordance with some embodiments of the present disclosure, the step of forming the amphiphilic polymer layer includes the sub-step of: forming a solution including an amphiphilic polymer material; applying the solution over the metal-including layer; and performing a drying process so as to obtain the amphiphilic polymer layer including the amphiphilic polymer material.

In accordance with some embodiments of the present disclosure, a method for manufacturing a semiconductor device includes: forming a first metallic layer over a semiconductor substrate, the first metallic layer having a first portion and a second portion; forming a hydrophobic polymer layer to cover the second portion of the first metallic layer; and modifying the first metallic layer, before forming the hydrophobic polymer layer, using an amphiphilic polymer material so as to enhance an adhesion between the hydrophobic polymer layer and the second portion of the first metallic layer.

In accordance with some embodiments of the present disclosure, the step of modifying the first metallic layer includes the sub-step of: forming a solution including an amphiphilic polymer material; applying the solution over the first metallic layer; and performing a drying process so as to obtain the amphiphilic polymer layer including the amphiphilic polymer material.

In accordance with some embodiments of the present disclosure, the amphiphilic polymer layer includes a polymer backbone, hydrophobic groups attached to the polymer backbone, and hydrophilic groups attached to the polymer backbone. A number of the hydrophobic groups is larger than that of the hydrophilic groups.

In accordance with some embodiments of the present disclosure, before forming the first metallic layer, further includes: forming a source/drain portion over the semiconductor substrate; forming a dielectric layer to cover the source/drain portion; forming a trench in the dielectric layer to expose the source/drain portion; and forming a silicide layer over the dielectric layer and in the trench to cover a trench sidewall and a trench bottom of the trench, the silicide layer having a first portion and a second portion which are respectively located beneath the first portion and the second portion of the first metallic layer, the second portions of the silicide layer and the first metallic layer being located in the trench.

In accordance with some embodiments of the present disclosure, the method further includes the step of: removing the first portions of the first metallic layer and the silicide layer that are exposed from the hydrophobic polymer layer, each of the second portions of the first metallic layer and the silicide layer having a sidewall region formed on the trench sidewall and a bottom region formed on the trench bottom; removing the hydrophobic polymer layer; partially removing the second portions of the first metallic layer and the silicide layer such that the sidewall region of the first metallic layer and the sidewall region of the silicide layer are removed while the bottom region of the first metallic layer and the bottom region of the silicide layer remain; and forming a second metallic layer on the remaining bottom region of the first metallic layer after removal of the sidewall region of each of the first metallic layer and the silicide layer.

In accordance with some embodiments of the present disclosure, a method for manufacturing a semiconductor device includes: forming a metal-including layer which includes a first portion and a second portion over a semiconductor substrate; forming a hydrophobic polymer layer to cover the second portion of the metal-including layer, leaving the first portion of the metal-including layer exposed from the hydrophobic polymer layer; modifying the metal-including layer, before forming the hydrophobic polymer layer, using an amphiphilic polymer material, so as to enhance a bonding force between the second portion of the metal-including layer and the hydrophobic polymer layer; and removing the first portion of the metal-including layer.

In accordance with some embodiments of the present disclosure, the first portion of the metal-including layer is formed to cover a first nanounit on a first region of the semiconductor substrate, and the second portion of the metal-including layer is formed to cover a second nanounit on a second region of the semiconductor substrate.

In accordance with some embodiments of the present disclosure, each of the first and second nanounits includes: a plurality of nanosheets which are spaced apart from each other; a plurality of metal plugs which are disposed to alternate with the nanosheets; a plurality of first gate dielectric portion which respectively surround the nanosheets to separate the nanosheets from the metal plugs; and a second gate dielectric portion disposed between each of the first and second portions of the metal-including layer and a corresponding one of the first and second regions of the semiconductor substrate.

In accordance with some embodiments of the present disclosure, one of the first and second nanounits is a portion of an n-type device, and the other one of the first and second nanounits is a portion of a p-type device.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a silicide layer over a semiconductor substrate;
    forming a metal-including layer over the silicide layer;
    forming a hydrophobic polymer layer over the metal-including layer;
    forming an amphiphilic polymer layer between the metal-including layer and the hydrophobic polymer layer so as to enhance a bonding force therebetween;
    selectively removing a first portion of the hydrophobic polymer layer to leave a second portion of the hydrophobic polymer layer;
    removing a first portion of the metal-including layer exposed from the second portion of the hydrophobic polymer layer to leave a second portion of the metal-including layer;
    removing a first portion of the silicide layer exposed from the second portion of the hydrophobic polymer layer to leave a second portion of the silicide layer;
    removing the second portion of the hydrophobic polymer layer; and
    forming a metallic layer on the second portion of the metal-including layer and the second portion of the silicide layer after removing the first portion of the metal-including layer and the first portion of the silicide layer.

2. The method of claim 1, wherein the metal-including layer has a hydrophilic surface confronting the amphiphilic polymer layer, and includes at least one of tungsten, tungsten nitride, aluminum oxide, titanium nitride, aluminum, tantalum nitride, cobalt, titanium, tantalum, nickel, molybdenum and copper.

3. The method of claim 1, wherein the hydrophobic polymer layer includes a bottom anti-reflective coating material.

4. The method of claim 1, wherein the amphiphilic polymer layer includes a polymer backbone, hydrophobic groups attached to the polymer backbone, and hydrophilic groups attached to the polymer backbone, a number of the hydrophobic groups being greater than that of the hydrophilic groups.

5. The method of claim 4, wherein the hydrophobic groups each independently is a saturated alkyl, or a phenyl.

6. The method of claim 5, wherein a number of carbon atom for the saturated alkyl ranges from one to three.

7. The method of claim 4, wherein the hydrophilic groups each independently is hydroxyl, carboxyl, amide or amino.

8. The method of claim 1, wherein the amphiphilic polymer layer is bonded to the hydrophobic polymer layer by van der Waals force.

9. The method of claim 1, wherein the amphiphilic polymer layer is bonded to the metal-including layer by hydrogen bond.

10. The method of claim 1, wherein forming the amphiphilic polymer layer includes:
    forming a solution including an amphiphilic polymer material;
    applying the solution over the metal-including layer; and
    performing a drying process so as to obtain the amphiphilic polymer layer including the amphiphilic polymer material.

11. A method for manufacturing a semiconductor device, comprising:
    forming a metal-including layer over and in a trench in a semiconductor structure, the metal-including layer covering a trench sidewall and a trench bottom of the trench;
    forming a hydrophobic polymer layer over the metal-including layer;
    forming an amphiphilic polymer layer between the metal-including layer and the hydrophobic polymer layer, the amphiphilic polymer having a hydrophilic surface confronting the metal-including layer, and a hydrophobic surface confronting the hydrophobic polymer layer;
    removing an upper portion of the hydrophobic polymer layer to allow a lower portion of the hydrophobic polymer layer to remain, such that a first portion of the metal-including layer is exposed from the lower portion of the hydrophobic polymer layer, and a second portion of the metal-including layer is covered by the lower portion of the hydrophobic polymer layer;

removing the first portion of the metal-including layer that is exposed from the lower portion of the hydrophobic polymer layer, the second portion of the metal-including layer having a sidewall region formed on the trench sidewall and a bottom region formed on the trench bottom;

removing the lower portion of the hydrophobic polymer layer;

partially removing the second portion of the metal-including layer, such that the sidewall region of the metal-including layer is removed while the bottom region of the metal-including layer remains; and forming a metallic layer on the bottom region of the metal-including layer after removal of the sidewall region of the metal-including layer.

12. The method of claim 11, wherein forming the amphiphilic polymer layer includes:

forming a solution including an amphiphilic polymer material;

applying the solution over the metal-including layer; and performing a drying process so as to obtain the amphiphilic polymer layer including the amphiphilic polymer material.

13. The method of claim 11, before forming the metal-including layer, further comprising:

forming a source/drain portion over a semiconductor substrate;

forming a dielectric layer to cover the source/drain portion;

forming the trench in the dielectric layer to expose the source/drain portion, thereby obtaining the semiconductor structure; and forming a silicide layer over the dielectric layer and in the trench to cover the trench sidewall and the trench bottom of the trench, the silicide layer having a first portion and a second portion which are respectively located beneath the first portion and the second portion of the metal-including layer, the second portion of the silicide layer and the second portion of the metal-including layer being located in the trench.

14. The method of claim 13, after removing the upper portion of the hydrophobic polymer layer, further comprising:

removing the first portion of the silicide layer that are exposed from the lower portion of the hydrophobic polymer layer, the second portion of the silicide layer having a sidewall region formed on the trench sidewall and a bottom region formed on the trench bottom; and partially removing the second portion of the silicide layer, such that the sidewall region of the silicide layer is removed while the bottom region of the silicide layer remains, the metallic layer being formed after removal of the sidewall region of the silicide layer.

15. A method for manufacturing a semiconductor device, comprising:

forming a metal-including layer over a semiconductor substrate;

forming a hydrophobic polymer layer over the metal-including layer;

forming an amphiphilic polymer layer between the metal-including layer and the hydrophobic polymer layer so as to form a hydrophobic surface over the metal-including layer;

selectively removing a first portion of the hydrophobic polymer layer to leave a second portion of the hydrophobic polymer layer;

removing a first portion of the metal-including layer exposed from the second portion of the hydrophobic polymer layer to leave a second portion of the metal-including layer;

removing the second portion of the hydrophobic polymer layer; and forming a metallic layer on the second portion of the metal-including layer.

16. The method of claim 15, wherein the first portion of the metal-including layer is formed to cover a first nanounit on a first region of the semiconductor substrate, and the second portion of the metal-including layer is formed to cover a second nanounit on a second region of the semiconductor substrate.

17. The method of claim 16, wherein each of the first and second nanounits includes:

nanosheets which are spaced apart from each other;

metal plugs which are disposed to alternate with the nanosheets;

first gate dielectric portions which respectively surround the nanosheets to separate the nanosheets from the metal plugs; and a second gate dielectric portion disposed between each of the first portion and the second portion of the metal-including layer and a corresponding one of the first region and the second region of the semiconductor substrate.

18. The method of claim 16, wherein one of the first nanounit and the second nanounit is a portion of an n-type device, and the other one of the first nanounit and the second nanounit is a portion of a p-type device.

19. The method of claim 15, wherein the amphiphilic polymer layer is formed after forming the metal-including layer and before forming the hydrophobic polymer layer.

20. The method of claim 13, wherein the source/drain portion includes multiple epitaxial layers.

* * * * *